United States Patent [19]
Gardner et al.

[11] Patent Number: 6,048,766
[45] Date of Patent: Apr. 11, 2000

[54] FLASH MEMORY DEVICE HAVING HIGH PERMITTIVITY STACKED DIELECTRIC AND FABRICATION THEREOF

[75] Inventors: Mark I. Gardner, Cedar Creek; Mark C. Gilmer, Austin; Thomas E. Spikes, Jr., Round Rock, all of Tex.

[73] Assignee: Advanced Micro Devices, Sunnyvale, Calif.

[21] Appl. No.: 09/172,410

[22] Filed: Oct. 14, 1998

[51] Int. Cl.$^7$ .................................................. H01L 21/336
[52] U.S. Cl. .......................... 438/257; 438/593; 438/594; 438/761; 438/763; 438/201; 438/211
[58] Field of Search .................................. 438/257, 593, 438/594, 761, 763, 201, 211

[56] References Cited

U.S. PATENT DOCUMENTS

| | | | |
|---|---|---|---|
| 4,992,391 | 2/1991 | Wang | 438/257 |
| 5,104,819 | 4/1992 | Freilberger et al. | 438/593 |
| 5,518,943 | 5/1996 | Tsunoda | 438/257 |
| 5,619,051 | 4/1997 | Endo | 257/316 |
| 5,840,607 | 11/1998 | Yeh et al. | 438/257 |

OTHER PUBLICATIONS

"Organometallic Compounds", Advanced materials, New Hill, NC, Internet at http://advanced–materials.com, 2 pages.

Lucovsky, G. et al., "Quasi–Stoichiometric Silicon Nitride Thin Films Deposited By Remote Plasma–Enhanced Chemical–Vapor Deposition", *Materials Research Society Symposium Proceedings*, 284:33–38, Symposium held Dec. 1–4, 1992, Boston, Massachusetts (Copyright 1993).

Ma, Y. et al., "Electrical Properties of Oxide—Nitride—Oxide, ONO, Heterostructure Fabricated By Low Temperature Remote PECVD", *Materials Research Society Symposium Proceedings*, 284:147–152, Symposium held Dec. 1–4, 1992, Boston, Massachusetts (Copyright 1993).

*Primary Examiner*—Carl Whitehead, Jr.
*Assistant Examiner*—Khanh Duong

[57] ABSTRACT

A memory device having a high performance stacked dielectric sandwiched between two polysilicon plates and method of fabrication thereof is provided. A memory device, in accordance with an embodiment, includes two polysilicon plates and a high permittivity dielectric stack disposed between the two polysilicon plates. The high permittivity dielectric stack includes a relatively high permittivity layer and two relatively low permittivity buffer layers. Each buffer layer is disposed between the relatively high permittivity layer and a respective one of the two polysilicon plates. The high permittivity layer may, for example, be a barium strontium titanate and the buffer layers may each include a layer of silicon nitride adjacent the respective polysilicon plate and a layer of titanium dioxide between the silicon nitride and the barium strontium titanate. The new high performance dielectric layer can, for example, increase the speed and reliability of the memory device as compared to conventional memory devices.

19 Claims, 3 Drawing Sheets

FLASH MEMORY DEVICE HAVING HIGH PERMITTIVITY STACKED DIELECTRIC AND FABRICATION THEREOF

FIELD OF THE INVENTION

The present invention generally relates to memory devices, and more particularly, to memory devices having high permittivity stacked dielectric structures and fabrication thereof.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such application is for memory devices or cells. A variety of memory device types have been developed including, for example, random access memory (RAM), read-only memory (ROM), programmable read-only memory (PROM). A variety of PROM memory devices have been developed which allow for reprogramming. Among the most useful are flash memory cells and electrically erasable PROM (EEPROM) cells. The programming of these memory devices can be erased, for example, by sending an electrical signal through the cells.

One conventional memory device is shown in FIG. 1. The memory device 100 generally includes a semiconductor substrate 102 on which a polysilicon plate 104, commonly referred to as a floating gate, is disposed. The floating gate 104 is used to define the state (e.g., a binary "0" or "1") of the memory device 100. Source and drain regions 106 are typically formed in regions of the substrate 102 adjacent the floating gate 104 by heavily doping these regions with a dopant material of a desired conductivity. The conductivity of the doped region depends on the type of impurity used to dope the region.

A channel region 108 is formed in the semiconductor substrate 102 beneath the floating gate electrode 104 and between the source and drain regions 106. The channel 108 is often lightly doped with a dopant material having a conductivity type opposite to that of the source and drain regions 106. The floating gate electrode 104 is generally separated from the substrate 102 by an insulating layer 1 10, typically an oxide layer such as $SiO_2$. The insulating layer 110 is provided to restrain current from flowing between the control gate electrode 104 and the source and drain regions 106 or channel region 108.

The memory device further includes a second polysilicon plate 112, commonly referred to as a control gate, disposed over the floating gate 104. The control gate 112 generally receives an input signal to control operation of the device. As noted above, the floating gate 104 is used to define the state of the memory device 100. Generally, the state of the device 100 is determined by the presence or absence of a conductive channel region 108, which in turn depends on the presence or absence of charge on the floating gate 104. Typically, the presence of charge on the floating gate 104 indicates a binary "1" state, while the absence of charge indicates a binary "0" state. The floating gate 104 is generally separated from the control gate 112 by a dielectric layer 116, typically an oxide or nitride layer such as silicon dioxide, silicon nitride, or oxynitride. The insulating layer 116 is provided to prevent charge from leaking from the floating gate electrode 112 and to control the speed of the device 100.

The dielectric layer 116 plays an important role in the operation of the memory device 100. For instance, the speed of the memory device 100 depends on the capacitive characteristics of the dielectric layer 116. In addition, the reliability of the memory device 100 depends on the ability of the floating gate 104 to retain charge over extended periods of time. The ability to retain charge also depends, at least in part, on the characteristics of the dielectric layer 116. Thus, in order to improve the performance of memory devices, new dielectric structures and fabrication techniques are needed.

SUMMARY OF THE INVENTION

Generally, the present invention relates to a memory device having a high performance dielectric layer sandwiched between two polysilicon plates and method of fabrication thereof. The new high performance dielectric layer can, for example, increase the speed and reliability of the memory device as compared to conventional memory devices.

One embodiment of the invention is a memory device that includes two polysilicon plates and a high permittivity dielectric stack disposed between the two polysilicon plates. The high permittivity dielectric stack includes a relatively high permittivity layer and two relatively low permittivity buffer layers. Each buffer layer is disposed between the relatively high permittivity layer and a respective one of the two polysilicon plates. The high permittivity layer may, for example, be a barium strontium titanate, while the buffer layers may each include a layer of nitride adjacent the respective polysilicon plate and a layer of titanium dioxide between the nitride layer and the barium strontium titanate.

Another embodiment is a method of fabricating a memory device. In this embodiment, a first polysilicon plate is formed over a substrate. A dielectric stack, which includes a relatively high permittivity layer disposed between two relatively low permittivity buffer layers, is formed over the first polysilicon plate. A second polysilicon plate is formed over the dielectric stack. The dielectric stack may, for example, be fabricated by sequentially depositing nitride, titanium dioxide, barium strontium titanate, titanium dioxide, and nitride over the first polysilicon plate. The two sets of nitride and titanium dioxide are used as the buffer layers for the higher permittivity barium strontium titanate.

The above summary of the present invention is not intended to describe each illustrated embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
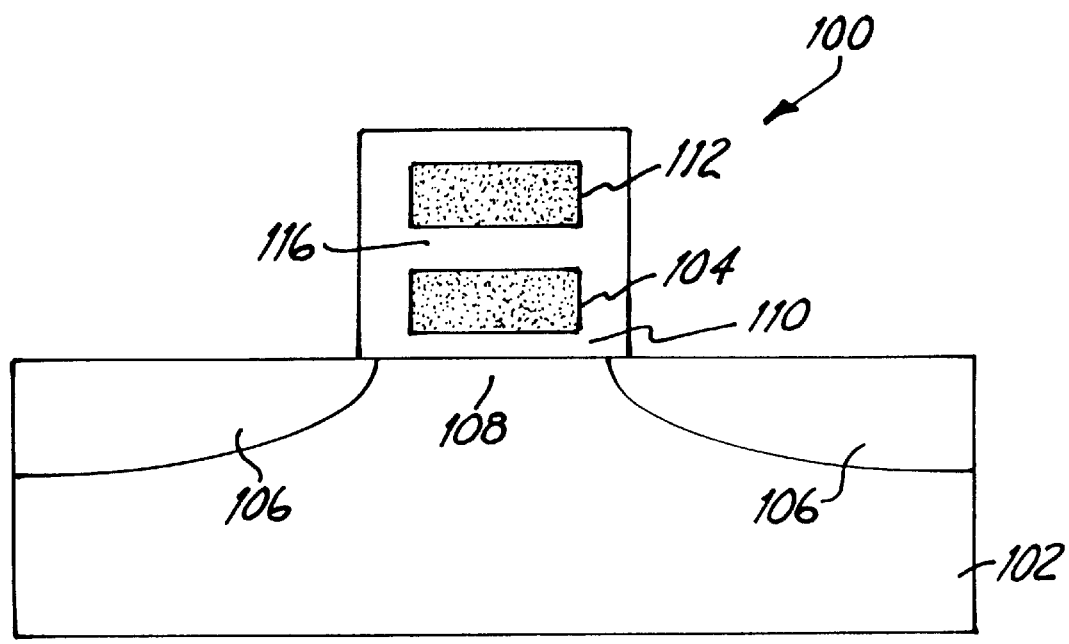
FIG. 1 illustrates a conventional memory device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to formation of a number of different memory devices. The invention is particularly suited for the formation of flash memory devices. While the present invention is not so limited, an appreciation of various aspects of the invention will be gained through a discussion of the various application examples operating in such environments.

Figure 2:
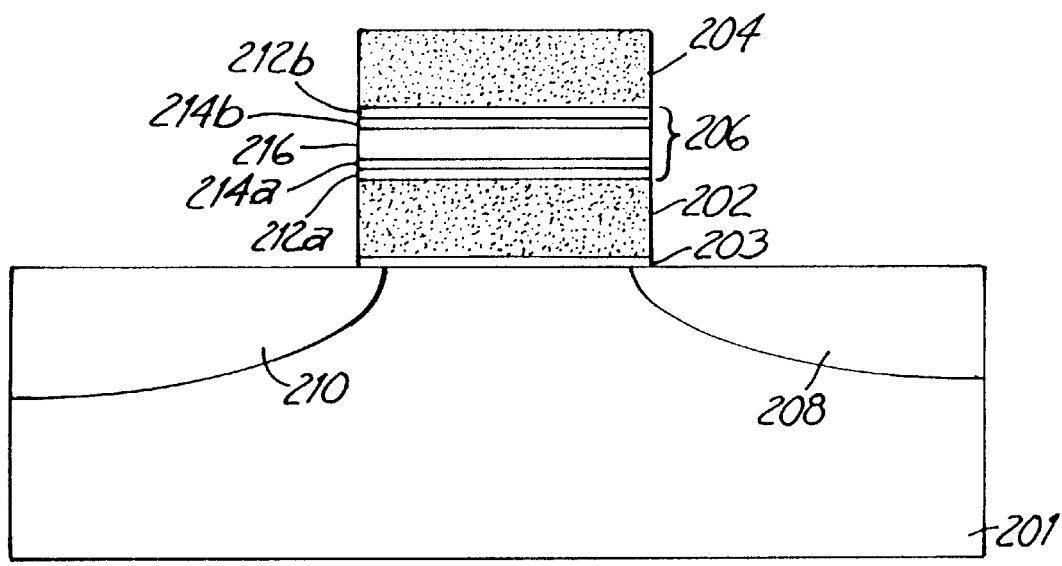
FIG. 2 illustrates a memory device in accordance with one embodiment of the invention.

FIG. 2 illustrates an exemplary memory device in accordance with one embodiment of the invention. The memory device 200 includes first and second polysilicon plates 202 and 204 separated by a high permittivity dielectric stack 206. The first polysilicon plate 202 is typically used as the floating gate for the memory device 200. The second polysilicon plate 204 is typically used as the control gate. Source and drain regions 208 and 210 may be disposed in the substrate 201 adjacent the first polysilicon plate 202.

The high permittivity dielectric stack 206 typically includes a relatively high permittivity layer sandwiched between two relatively low permittivity layers. In the illustrated embodiment, the dielectric stack 206 is a silicon nitride-titanium dioxide-barium strontium titanate-titanium dioxide-silicon nitride stacked structure. Each pair of silicon nitride (dielectric constant (k) of about 8) and titanium dioxide (k of about 30–60) layers 212a and 214a and 212b and 214b serves as a buffer layer for the higher permittivity barium strontium titanate layer 216 (k of about 100) and one of the polysilicon plates 202 and 204.

The silicon nitride layers 212a and 212b serve to insulate the titanium dioxide layers 214a and 214b from the polysilicon plates 202 and 204. Without the silicon nitride layers 212a and 212b, the titanium dioxide layers 214a and 214b may interact with the polysilicon plates 202 and 204 to form silicon dioxide and undesirably, and typically uncontrollably, increase the capacitance of the stacked structure. The thicknesses of the silicon nitride layers 212a and 212b are typically selected in consideration of adequate insulation, taking into account subsequent thermal treatment of the memory device 200. Suitable thicknesses for the silicon nitride layers 212a and 212b range from about 5 to 10 angstroms (Å) for many applications.

The titanium dioxide layers 214a and 214b are provide to prevent interaction between the high permittivity barium strontium titanate layer 216 and the silicon nitride layers. Without the titanium dioxide layers 214a and 214b, the barium strontium titanate layer 216 may react with the silicon nitride layers 212a and 212b to form a hybrid BST-nitride dielectric, the thickness and capacitance of which could not be reliably controlled. Like the silicon nitride layers, the thicknesses of the titanium dioxide layers 214a and 214b are typically selected in consideration of adequate insulation, taking into account subsequent thermal treatment of the memory device 200. Suitable thicknesses for the titanium dioxide layers 214a and 214b range from about 10 to 15 Å for many applications.

The thickness of the barium strontium titanate layer 216 is typically selected in consideration of the desired capacitive characteristics and leakage characteristics of the dielectric stack 206. The thickness of the barium strontium titanate layer 210 is usually at least two to three times thicker than the silicon nitride layers 212a,b or titanium dioxide layers 214a,b. For many applications, the thickness of the barium strontium titanate layer 216 is typically about 100 Å±25 Å.

Advantageously, this stacked structure can be reliably and controllably formed, while providing increased speed and reliability of the memory device 200 relative to conventional memory devices. The use of cascading buffer layers prevents undesirable interaction between the various layers in the dielectric stack and allows for highly controlled formation of the stack. The stacked structure 206 allows provides low leakage current and quick charge transfer between the two polysilicon plates 202 and 204. For example, using 100 Å of barium strontium titanate along with 5–10 Å of silicon nitride and 10–15 Å of titanium dioxide (assuming a k of 45), the stacked structure is provided with a capacitance equivalent to about 7.5 to 10.5 Å of silicon dioxide (k of about 4). This low equivalent capacitance allows for fast charge transfer and thus higher speed memory devices. Moreover, with these thickness, the stacked structure can have leakage currents of about 1E–10 ($1 \times 10^{-10}$) to 1E–11 ($1 \times 10^{-11}$) amps or less.

The memory device 200 may be formed using a variety of different techniques. One exemplary technique will be discussed with reference to FIGS. 2 and 3. In this embodiment, a thin gate insulating layer 203 is formed over the substrate 201 using, for example, known deposition or growth techniques. A layer of polysilicon 202 is then formed over the gate insulating layer 203. This may be carried out using, for example, known deposition techniques. Next, the layers of the stacked dielectric structure are formed. A first silicon nitride layer 212a is deposited over the polysilicon layer 204 using a remote plasma enhanced chemical vapor deposition (RPECVD) technique. This technique allows for the formation of relatively thin layers of silicon nitride at relatively low temperatures (e.g., 50 to 350° C.) and pressures (0.01 to 2 atmospheres). As noted above, the silicon nitride will be used to buffer a titanium dioxide from the polysilicon layer 204.

Next, a first layer of titanium dioxide 214a is deposited over the first silicon nitride layer 212a using a misted deposition technique. Misted deposition of titanium dioxide generally involves passing carbon-based titanium precursors through an atomizer to form a mist and depositing the mist over the substrate 201. Details of an exemplary technique for misted deposition of titanium dioxide will be described below. As noted above, the titanium dioxide layer 214a is provided to prevent interaction between a barium strontium titanate layer and the silicon nitride layer 212a. The barium strontium titanate layer 216 is then deposited over the first titanium dioxide layer 214a using a misted deposition technique. Details of an exemplary technique for misted deposition of barium strontium titanate will also be described below. Next, a second layer of titanium dioxide 214b and a second layer of silicon nitride 212b are deposited over the barium strontium titanate layer 216 using misted and RPECVD deposition techniques, respectively. Each of these depositions may be carried out in a similar manner as discussed above with respect to the first layers of silicon nitride 212a and titanium dioxide 214a.

Figure 3:
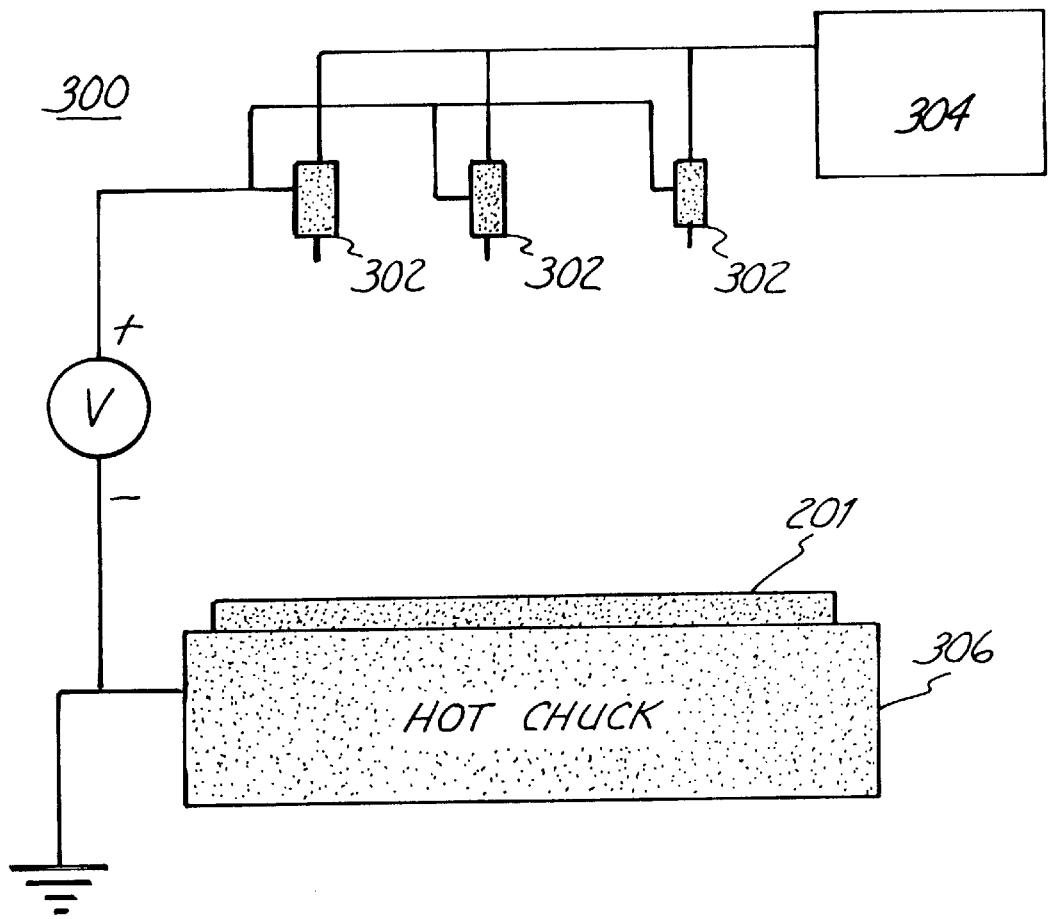
FIG. 3 illustrates an exemplary deposition system in accordance with one embodiment of the invention.

The misted deposition techniques discussed above may be carried out using the deposition system illustrated in FIG. 3. The misted deposition system 300 generally includes one or more atomizers 302 coupled to a source 304 of precursors. The atomizers 302 are typically disposed in a deposition chamber above a chuck 306 on which the substrate 201 (and overlying layers) may be mounted. The atomizers 302 may be electrostatic, in which case the atomizers 302 are positively charged and the chuck/substrate is grounded.

The precursors are typically liquid carbon-based precursors (e.g., alkoxides or diketonates), the type of which depends on the material being deposited. Precursors used to form the titanium dioxide layers 212a and 212b include titanium alkoxides, such as titanium isopropoxide. The barium strontium titanate layer 216 may be formed using two mixtures of precursors: a mixture of a barium diketonate (e.g, $Ba(O_2C_{11}H_{19})_2$ or $Ba(TMHD)_2$) and a titanium alkoxide (e.g., titanium isopropoxide) and a mixture of a strontium diketonate(e.g., $Sr(O_2C_{11}H_{19})_2$ or $Sr(TMHD)_2$) and a titanium alkoxide (e.g., titanium isopropoxide). The two mixtures may be provided from separate sources to the atomizers 302. Alternatively, a barium precursor, a titanium precursor and a strontium precursor from three different sources may be provided.

The misted deposition process is typically performed at atmospheric or room pressure with the substrate 201 heated to an elevated temperature (e.g., 300° C.) by heating the chuck 306. In operation, the precursors are passed through the atomizers 302 to form a mist which deposits on the substrate 201. The flow rate of the precursors is typically selected in consideration of the desired thickness of the deposited layer. For many applications, the precursor flow rate may be about 100 sccm (standard cubic centimeters per minute) or less. A carrier gas, such as nitrogen, may also be flowed into the system chamber to more evenly spread the mist over the substrate 201. The flow rate of nitrogen may range from about 10 to 40 liters per minute for many applications. The deposited mist reacts with the heated substrate 201 to form the deposited material (e.g. titanium dioxide or barium strontium titanate depending on the precursors used). During this process, the carbon in the precursors typically forms $CO_2$ and is exhausted. The atomized precursors provide an oxygen source for the reaction. Advantageously, additional oxygen may be provided (e.g., in a mixture with a nitrogen carrier gas) to ensure a full reaction of the precursors and full removal of carbon as $CO_2$. Suitable flow rates of oxygen range from about 2 to 10 liters per minute.

The RPECVD and misted deposition techniques allow for controlled formation of the layer of the dielectric stack. While each of these depositions may be carried out in separate chambers, a multiple chamber tool (each chamber being used for a specific deposition) may be used to carry out all of the depositions. The use of a multiple chamber tool may further enhance the quality of the stacked structure and may also increase the speed with which the processing may be performed.

After forming the stacked dielectric, the structure may be subject to an ultraviolet (UV) cure using known techniques in order to form a networked dielectric structure. The UV cure may be followed by a water vapor anneal to eliminate any dangling bonds between the various dielectric layers. This may be carried out by annealing the substrate in a hydrogen and oxygen bearing ambient at a temperature of about 700–900° C. The time period of the anneal will vary with the annealing tool used. Using a rapid thermal anneal chamber, the anneal may be performed for about 30 to 50 seconds. In a diffusion tube, the time period may be increased to about 15 to 30 minutes. The elimination of dangling bonds through the water vapor anneal can decrease the likelihood of charge trapping in the dielectric structure and can also increase the ability of the stacked dielectric to transmit charge.

A second polysilicon layer 206 is then formed (e.g., deposited) over the second silicon nitride layer 212b using known deposition techniques. Portions of the polysilicon layers 202 and 204 and the intermediate dielectric stack may then be selectively removed to form the structure illustrated in FIG. 2. The selective removal of these layers may be performed using, for example, known etching techniques. Fabrication may continue with standard memory cell processing to complete the ultimate device structure.

It should be stressed that the above process and structure is provided by way of example and not of limitation. A number of different high permittivity dielectric stacked structures and fabrication methods fall within the scope of the invention. For example, materials other than barium strontium titanate may be used the high permittivity layer of a stacked dielectric. Moreover, depending on the high permittivity material, the number of layers which buffer the high permittivity material from the polysilicon plates can vary. In addition, the process used to form the stacked dielectric may also be modified. For instance, instead of the RPECVD and misted deposition techniques discussed above, well known chemical vapor deposition, plasma vapor deposition, or metal organic chemical vapor deposition techniques may be used to form the layers of the stacked structure.

In sum, the present invention is applicable to a number of different memory devices which may benefit from increased speed and/or reliability and a number of different methods of fabricating such devices. Accordingly, the present invention should not be considered limited to the particular examples described above, but rather should be understood to cover all aspects of the invention as fairly set out in the attached claims. Various modifications, equivalent processes, as well as numerous communication devices to which the present invention may be applicable will be readily apparent to those of skill in the art upon review of the present specification. The claims are intended to cover such modifications and devices.

We claim:

1. A memory device fabrication method, comprising:
   forming a first polysilicon plate over a substrate;
   forming a dielectric stack over the first polysilicon plate, the dielectric stack including a relatively high permittivity layer disposed between two relatively low permittivity buffer layers; and
   forming a second polysilicon plate over the dielectric stack;
   wherein forming the dielectric stack includes:
     forming a first buffer layer over the first polysilicon plate;
     forming a second buffer layer over the first buffer layer, wherein the first and second buffer layers form one of the two relatively low permittivity layers;
     forming the relatively high permittivity layer over the second buffer layer;
     forming a third buffer layer over the relatively high permittivity layer; and
     forming a fourth buffer layer over the third buffer layer, wherein the third and fourth buffer layers form the other of the two relatively low permittivity layers;
     wherein the second polysilicon plate is formed over the fourth buffer layer.

2. The fabrication method of claim 1, wherein the first and fourth buffer layers are formed from the same material and the second and third buffer layers are formed from the same material.

3. The fabrication method of claim 2, wherein:
   the first and fourth buffer layers are formed from a nitride;
   the second and third buffer layers are formed from a titanium oxide; and the relatively high permittivity layer is formed from barium strontium titanate.

4. The fabrication method of claim 1, wherein the relatively high permittivity layer has a thickness greater than a thickness of each of the first, second, third and fourth buffer layers.

5. The fabrication method of claim 4, wherein the relatively high permittivity layer has a thickness greater than twice the thickness of each of the first, second, third and fourth buffer layers.

6. The fabrication method of claim 4, wherein the relatively high permittivity layer has a thickness greater than three times the thickness of each of the first, second, third and fourth buffer layers.

7. A memory device fabrication method, comprising:

forming a first polysilicon plate over a substrate;

forming a dielectric stack over the first polysilicon plate to provide a capacitance/unit area of the dielectric stack equivalent to about 7.5 to 10.5 angstroms of silicon dioxide, the dielectric stack including a relatively high permittivity layer disposed between two relatively low permittivity buffer layers; and forming a second polysilicon plate over the dielectric stack.

8. The fabrication method of claim 7, wherein forming the dielectric stack includes forming the dielectric stack to provide a leakage current of about 1E–10 amps or less.

9. The fabrication method of claim 7, wherein forming the dielectric stack includes forming the dielectric stack to provide a leakage current of about 1E–11 amps or less.

10. A memory device fabrication method, comprising:

forming a first polysilicon layer over a substrate;

depositing a first nitride layer over the first polysilicon layer;

depositing a first titanium dioxide layer over the first nitride layer;

depositing a barium strontium titanate layer over the first titanium dioxide layer;

depositing a second titanium dioxide layer over the barium strontium titanate layer;

depositing a second nitride layer over the second titanium dioxide layer; and forming a second polysilicon layer over the second titanium dioxide layer.

11. The fabrication method of claim 10, wherein depositing the first and second nitride layers includes using a remote plasma enhanced chemical vapor deposition process.

12. The fabrication method of claim 11, wherein depositing the first and second titanium dioxide layers includes using a misted deposition process.

13. The fabrication method of claim 12, wherein depositing the barium strontium titanate layer includes using a misted deposition process.

14. The fabrication method of claim 13, wherein the misted deposition process includes heating the substrate, atomizing liquid carbon-based metal precursors to form a mist, and reacting the mist with the heated substrate.

15. The fabrication method of claim 14, wherein the misted deposition process further includes mixing oxygen with the mist.

16. The fabrication method of claim 14, wherein the substrate is heated to about 300° C. and the reaction is carried out at atmospheric pressure.

17. The fabrication method of claim 10, further including curing the device after depositing the second silicon nitride layer.

18. The fabrication method of claim 17, further including annealing the device in a hydrogen and oxygen bearing ambient after curing the device.

19. The fabrication method of claim 18, wherein the annealing is performed before forming the second polysilicon layer.

* * * * *